United States Patent
Chien

(10) Patent No.: US 11,202,391 B2
(45) Date of Patent: Dec. 14, 2021

(54) HEAT DISSIPATING STRUCTURE CAPABLE OF CONDUCTING HEAT FROM A DETACHABLE MODULE TO A CASE MODULE, AND ELECTRONIC DEVICE THEREWITH

(71) Applicant: Moxa Inc., New Taipei (TW)

(72) Inventor: Chih-Hou Chien, New Taipei (TW)

(73) Assignee: Moxa Inc., New Taipei (TW)

( * ) Notice: Subject to any disclaimer, the term of this patent is extended or adjusted under 35 U.S.C. 154(b) by 0 days.

(21) Appl. No.: 17/012,013

(22) Filed: Sep. 3, 2020

(65) Prior Publication Data

US 2021/0267088 A1 Aug. 26, 2021

(30) Foreign Application Priority Data

Feb. 20, 2020 (TW) .................................. 109105547

(51) Int. Cl.
*H05K 7/20* (2006.01)
*H05K 7/14* (2006.01)

(52) U.S. Cl.
CPC ......... *H05K 7/2039* (2013.01); *H05K 7/1461* (2013.01)

(58) Field of Classification Search
CPC ......... H01L 23/467; G06F 1/20; G06F 1/203; G06F 1/181; G06F 1/185; H05K 1/141; H05K 1/14; H05K 7/2039; H05K 7/20409; H05K 7/20436; H05K 7/205; H05K 7/20509; H05K 7/1461
See application file for complete search history.

(56) References Cited

U.S. PATENT DOCUMENTS

| | | | |
|---|---|---|---|
| 6,181,553 B1 * | 1/2001 | Cipolla | G06F 1/1632 165/104.33 |
| 6,431,765 B1 * | 8/2002 | Chen | G02B 6/4277 385/139 |
| 6,749,448 B2 * | 6/2004 | Bright | G02B 6/4201 439/160 |
| 7,667,972 B2 * | 2/2010 | Chen | H05K 7/2049 361/709 |

(Continued)

FOREIGN PATENT DOCUMENTS

| CN | 109392266 A | 2/2019 |
|---|---|---|
| CN | 110690616 A | 1/2020 |

*Primary Examiner* — Adam B Dravininkas
(74) *Attorney, Agent, or Firm* — Winston Hsu

(57) ABSTRACT

A heat dissipating structure is for conducting heat generated by a detachable module to a case module. The heat dissipating structure includes a driving component disposed on a side of the detachable module, a driven component pivotally disposed on the case module and a heat dissipating component connected to the driven component. The driving component is slidable relative to the case module along with the detachable module. The heat dissipating component is for abutting against the detachable module and the case module. When the detachable module slides relative to the case module along an installing direction, the driving component drives the driven component to pivot relative to the case module in a first pivoting direction to drive the heat dissipating component to abut against the detachable module and the case module for conducting the heat generated by the detachable module to the case module by the heat dissipating component.

20 Claims, 7 Drawing Sheets

(56) References Cited

U.S. PATENT DOCUMENTS

| | | | | |
|---|---|---|---|---|
| 8,760,870 | B2* | 6/2014 | Yamamoto | G02B 6/4201 |
| | | | | 361/710 |
| 8,911,244 | B2* | 12/2014 | Elison | H05K 7/20409 |
| | | | | 439/137 |
| 2003/0161108 | A1* | 8/2003 | Bright | G02B 6/4277 |
| | | | | 361/707 |
| 2005/0074995 | A1* | 4/2005 | Kimura | H05K 5/0295 |
| | | | | 439/159 |
| 2005/0148223 | A1* | 7/2005 | Shirk | G02B 6/4246 |
| | | | | 439/160 |
| 2005/0195565 | A1* | 9/2005 | Bright | H04B 1/036 |
| | | | | 361/688 |
| 2005/0215098 | A1* | 9/2005 | Muramatsu | H01R 13/6335 |
| | | | | 439/159 |
| 2007/0274046 | A1* | 11/2007 | Choi | H05K 5/0295 |
| | | | | 361/702 |
| 2020/0396859 | A1* | 12/2020 | Liu | G11B 33/128 |

* cited by examiner

HEAT DISSIPATING STRUCTURE CAPABLE OF CONDUCTING HEAT FROM A DETACHABLE MODULE TO A CASE MODULE, AND ELECTRONIC DEVICE THEREWITH

BACKGROUND OF THE INVENTION

1. Field of the Invention

The present invention relates to a heat dissipating structure and an electronic device therewith, and more specifically, to a heat dissipating structure capable of conducting heat from a detachable module to a case module, and an electronic device therewith.

2. Description of the Prior Art

In order to satisfy various requirements in different application fields, modularity has gradually become a mainstream trend of electronic devices. Currently, a modular electronic device usually includes a case and at least one detachable module installed on the case. The detachable module can be, for example, a hard disk drive module or a wireless communication module. The modular electronic device with fanless cooling design usually utilizes a fixed heat dissipating structure to conduct heat generated by the detachable module to the case to reduce temperature of the detachable module. However, such configuration has long heat dissipation path and high heat resistance, which causes a technical problem of that the heat generated by the detachable module cannot be dissipated rapidly. Furthermore, when it is desired to detach the detachable module from the case, it is required to open the case and detach the fixed heat dissipating structure from the case before detaching the detachable module from the case for preventing interference of detachment of the detachable module caused by the fixed heat dissipating structure, which causes inconvenience in use.

SUMMARY OF THE INVENTION

Therefore, it is an objective of the present invention to provide a heat dissipating structure capable of conducting heat from a detachable module to a case module, and an electronic device therewith for solving the aforementioned problems.

In order to achieve the aforementioned objective, the present invention discloses a heat dissipating structure for conducting heat generated by a detachable module to a case module. The detachable module is slidably disposed in the case module in a detachable manner. The heat dissipating structure includes a driving component, a driven component and a heat dissipating component. The driving component is disposed on a side of the detachable module and slidable relative to the case module along with the detachable module. The driven component is pivotally disposed on the case module. The heat dissipating component is connected to the driven component and for abutting against the detachable module and the case module. When the detachable module slides relative to the case module along an installing direction, the driving component drives the driven component to pivot relative to the case module in a first pivoting direction to drive the heat dissipating component to abut against the detachable module and the case module for conducting the heat generated by the detachable module to the case module by the heat dissipating component.

According to an embodiment of the present invention, the driving component includes an installing driving portion. The driven component includes an installing abutting portion, and the driving component drives the driven component to pivot relative to the case module in the first pivoting direction by abutment of the installing driving portion and the installing abutting portion when the detachable module slides relative to the case module along the installing direction.

According to an embodiment of the present invention, the installing driving portion is an inclined surface. The installing abutting portion a protrusion, and the installing abutting portion is located at a position corresponding to the installing driving portion.

According to an embodiment of the present invention, when the detachable module slides relative to the case module along a detaching direction opposite to the installing direction, the driving component drives the driven component to pivot relative to the case module in a second pivoting direction opposite to the first pivoting direction to drive the heat dissipating component to separate from the detachable module and the case module.

According to an embodiment of the present invention, the driving component includes a detaching driving portion. The driven component includes a detaching abutting portion, and the driving component drives the driven component to pivot relative to the case module in the second pivoting direction by abutment of the detaching driving portion and the detaching abutting portion when the detachable module slides relative to the case module along the detaching direction.

According to an embodiment of the present invention, the driving component further includes an installing driving portion. The driven component further includes an installing abutting portion, and the driving component drives the driven component to pivot relative to the case module in the first pivoting direction by abutment of the installing driving portion and the installing abutting portion when the detachable module slides relative to the case module along the installing direction.

According to an embodiment of the present invention, the installing driving portion and the detaching driving portion are inclined surfaces. The installing abutting portion and the detaching abutting portion are protrusions. The installing abutting portion and the detaching abutting portion are respectively located at positions corresponding to the installing driving portion and the detaching driving portion, and the detaching driving portion and the installing driving portion are arranged along the installing direction sequentially.

According to an embodiment of the present invention, an inclined direction of the installing driving portion is opposite to an inclined direction of the detaching driving portion.

According to an embodiment of the present invention, the heat dissipating structure further includes a resilient component connected to the driven component and the case module, and the resilient component applies a torque in the first pivoting direction or the second pivoting direction to the driven component.

According to an embodiment of the present invention, the heat dissipating structure further includes a resilient component connected to the driven component and the case module, and the resilient component applies a torque in the first pivoting direction or a second pivoting direction opposite to the first pivoting direction to the driven component.

In order to achieve the aforementioned objective, the present invention further discloses an electronic device. The electronic device includes a case module, a detachable module and a heat dissipating structure. The detachable module is slidably disposed in the case module in a detachable manner. The heat dissipating structure is for conducting heat generated by the detachable module to the case module. The heat dissipating structure includes a driving component, a driven component and a heat dissipating component. The driving component is disposed on a side of the detachable module and slidable relative to the case module along with the detachable module. The driven component is pivotally disposed on the case module. The heat dissipating component is connected to the driven component and for abutting against the detachable module and the case module. When the detachable module slides relative to the case module along an installing direction, the driving component drives the driven component to pivot relative to the case module in a first pivoting direction to drive the heat dissipating component to abut against the detachable module and the case module for conducting the heat generated by the detachable module to the case module by the heat dissipating component.

According to an embodiment of the present invention, the driving component includes an installing driving portion. The driven component includes an installing abutting portion, and the driving component drives the driven component to pivot relative to the case module in the first pivoting direction by abutment of the installing driving portion and the installing abutting portion when the detachable module slides relative to the case module along the installing direction.

According to an embodiment of the present invention, the installing driving portion is an inclined surface. The installing abutting portion a protrusion, and the installing abutting portion is located at a position corresponding to the installing driving portion.

According to an embodiment of the present invention, when the detachable module slides relative to the case module along a detaching direction opposite to the installing direction, the driving component drives the driven component to pivot relative to the case module in a second pivoting direction opposite to the first pivoting direction to drive the heat dissipating component to separate from the detachable module and the case module.

According to an embodiment of the present invention, the driving component includes a detaching driving portion. The driven component includes a detaching abutting portion, and the driving component drives the driven component to pivot relative to the case module in the second pivoting direction by abutment of the detaching driving portion and the detaching abutting portion when the detachable module slides relative to the case module along the detaching direction.

According to an embodiment of the present invention, the driving component further includes an installing driving portion. The driven component further includes an installing abutting portion, and the driving component drives the driven component to pivot relative to the case module in the first pivoting direction by abutment of the installing driving portion and the installing abutting portion when the detachable module slides relative to the case module along the installing direction.

According to an embodiment of the present invention, the installing driving portion and the detaching driving portion are inclined surfaces. The installing abutting portion and the detaching abutting portion are protrusions. The installing abutting portion and the detaching abutting portion are respectively located at positions corresponding to the installing driving portion and the detaching driving portion, and the detaching driving portion and the installing driving portion are arranged along the installing direction sequentially.

According to an embodiment of the present invention, an inclined direction of the installing driving portion is opposite to an inclined direction of the detaching driving portion.

According to an embodiment of the present invention, the heat dissipating structure further includes a resilient component connected to the driven component and the case module, and the resilient component applies a torque in the first pivoting direction or the second pivoting direction to the driven component.

According to an embodiment of the present invention, the heat dissipating structure further includes a resilient component connected to the driven component and the case module, and the resilient component applies a torque in the first pivoting direction or a second pivoting direction opposite to the first pivoting direction to the driven component.

In summary, the present invention utilizes the driving component to drive the driven component to pivot relative to the case module to drive the heat dissipating component to abut against or separate from the detachable module and the case module when the detachable module slides relative to the case module. The present invention not only has advantages of simple structure, short heat dissipating path and low heat resistance but also solves a technical problem in the prior art of inconvenient use that the heat dissipating structure needs to be detached from the case module before detaching the detachable module from the case module. Therefore, the present invention has enhanced heat dissipation and enhanced operability.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description of the preferred embodiments, reference is made to the accompanying drawings which form a part hereof, and in which is shown by way of illustration specific embodiments in which the invention may be practiced. In this regard, directional terminology, such as "top," "bottom," "front," "back," etc., is used with reference to the orientation of the Figure (s) being described. The components of the present invention can be positioned in a number of different orientations. As such, the directional terminology is used for purposes of illustration and is in no way limiting. Accordingly, the drawings and descriptions will be regarded as illustrative in nature and not as restrictive.

Figure 1:
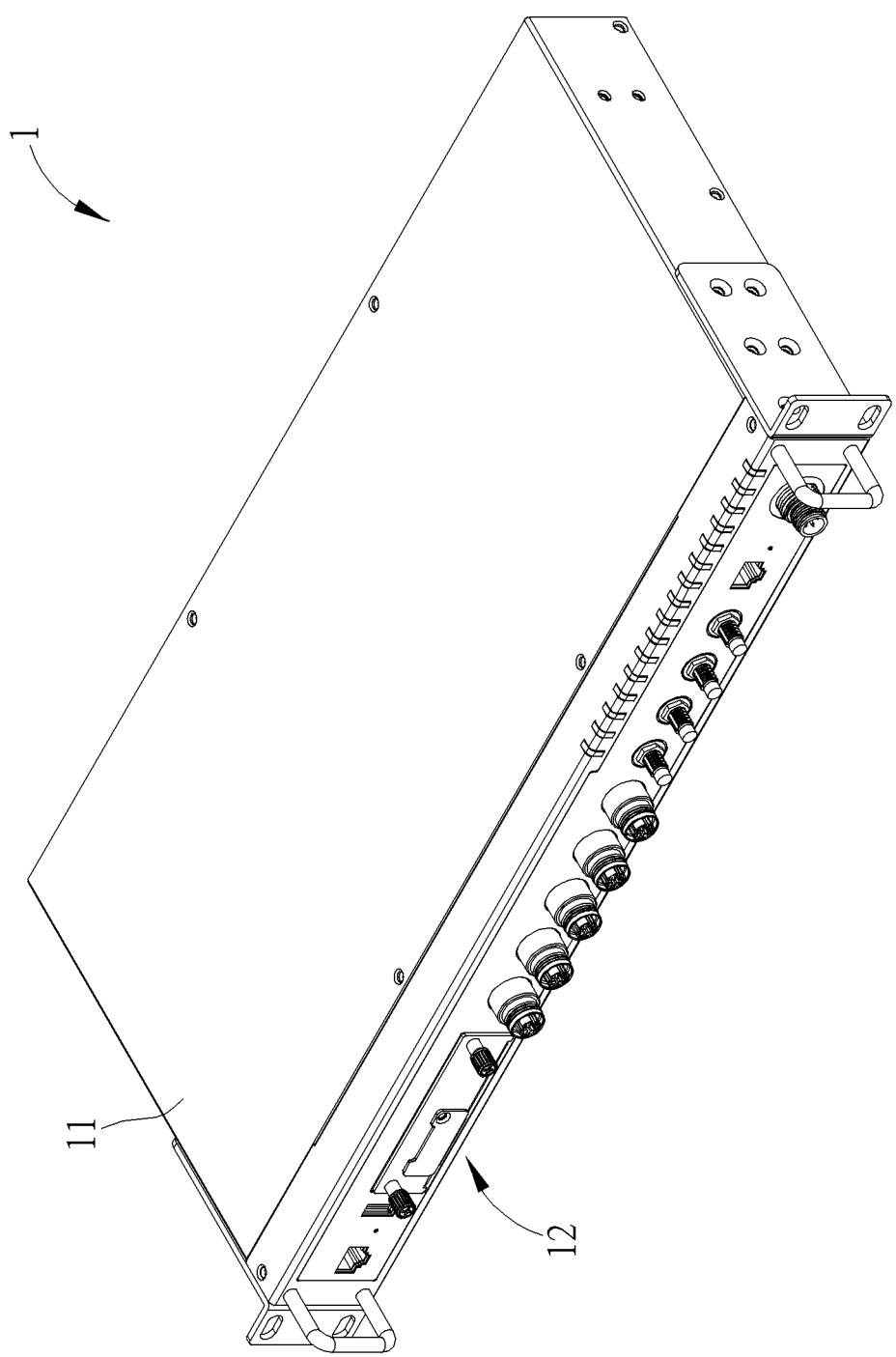
FIG. 1 is a partial schematic diagram of an electronic device according to an embodiment of the present invention.
Figure 2:
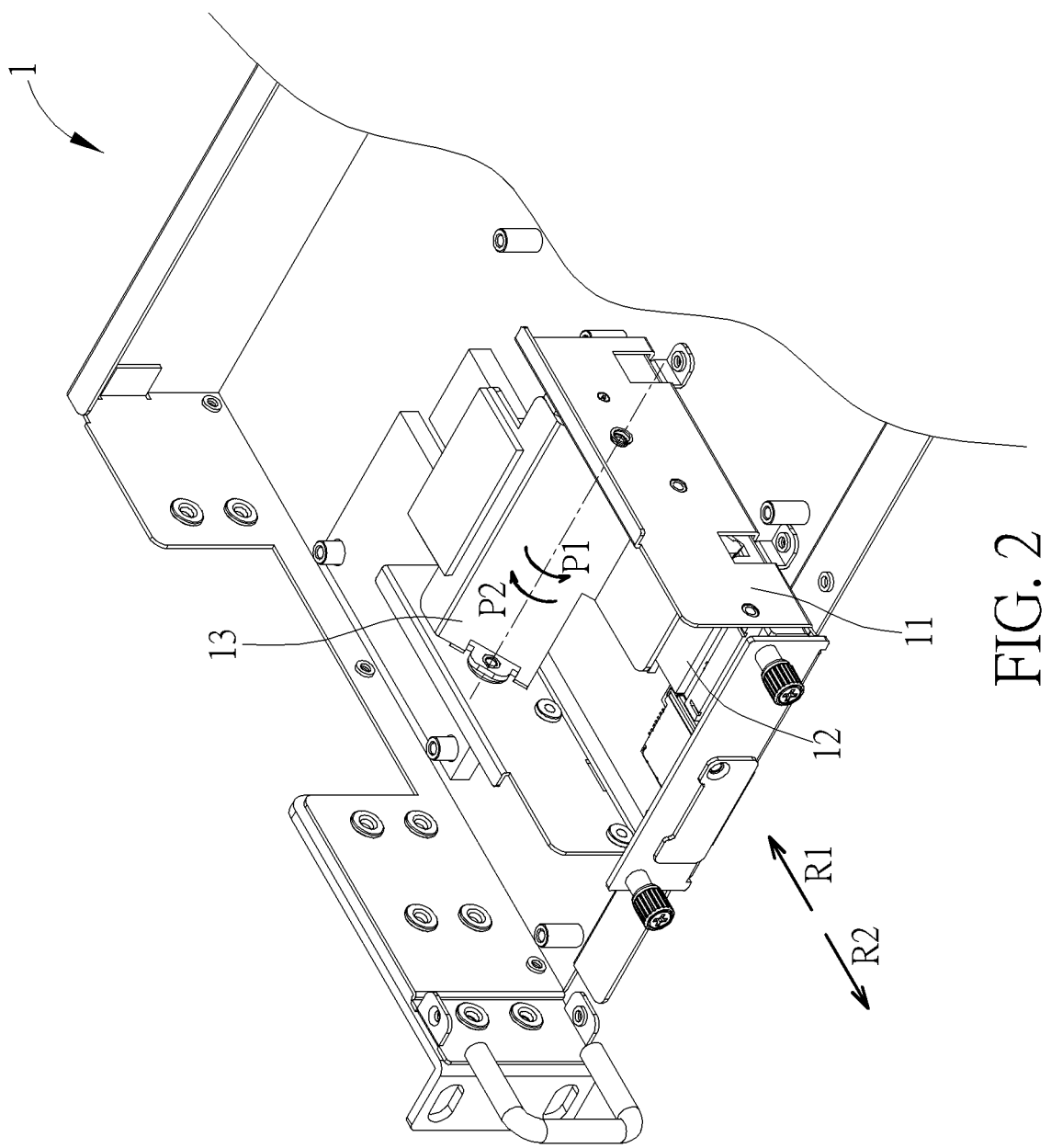
FIG. 2 and FIG. 3 are partial enlarged diagrams of internal structure of the electronic device according to the embodiment of the present invention.
Figure 3:
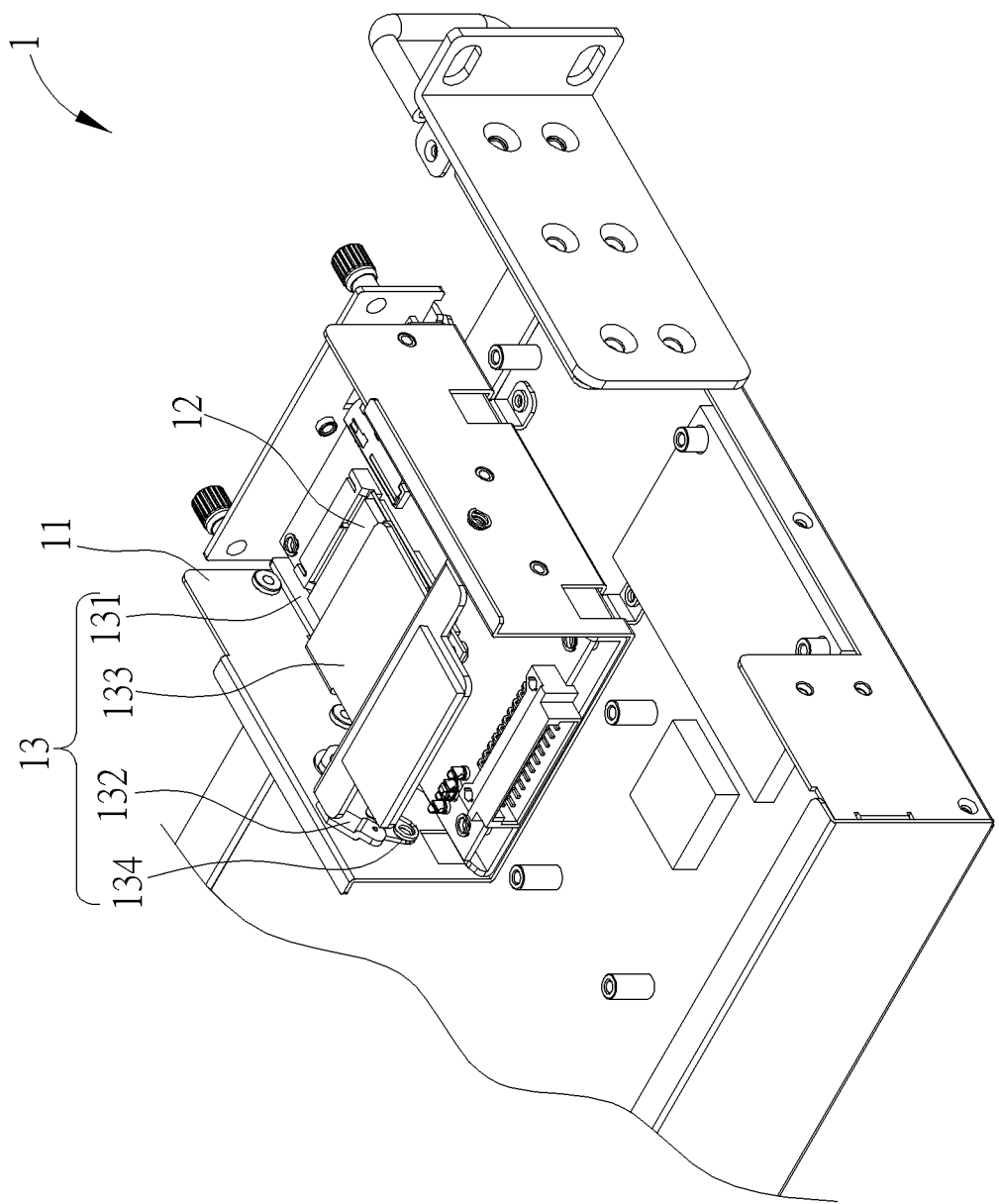
Figure 4:
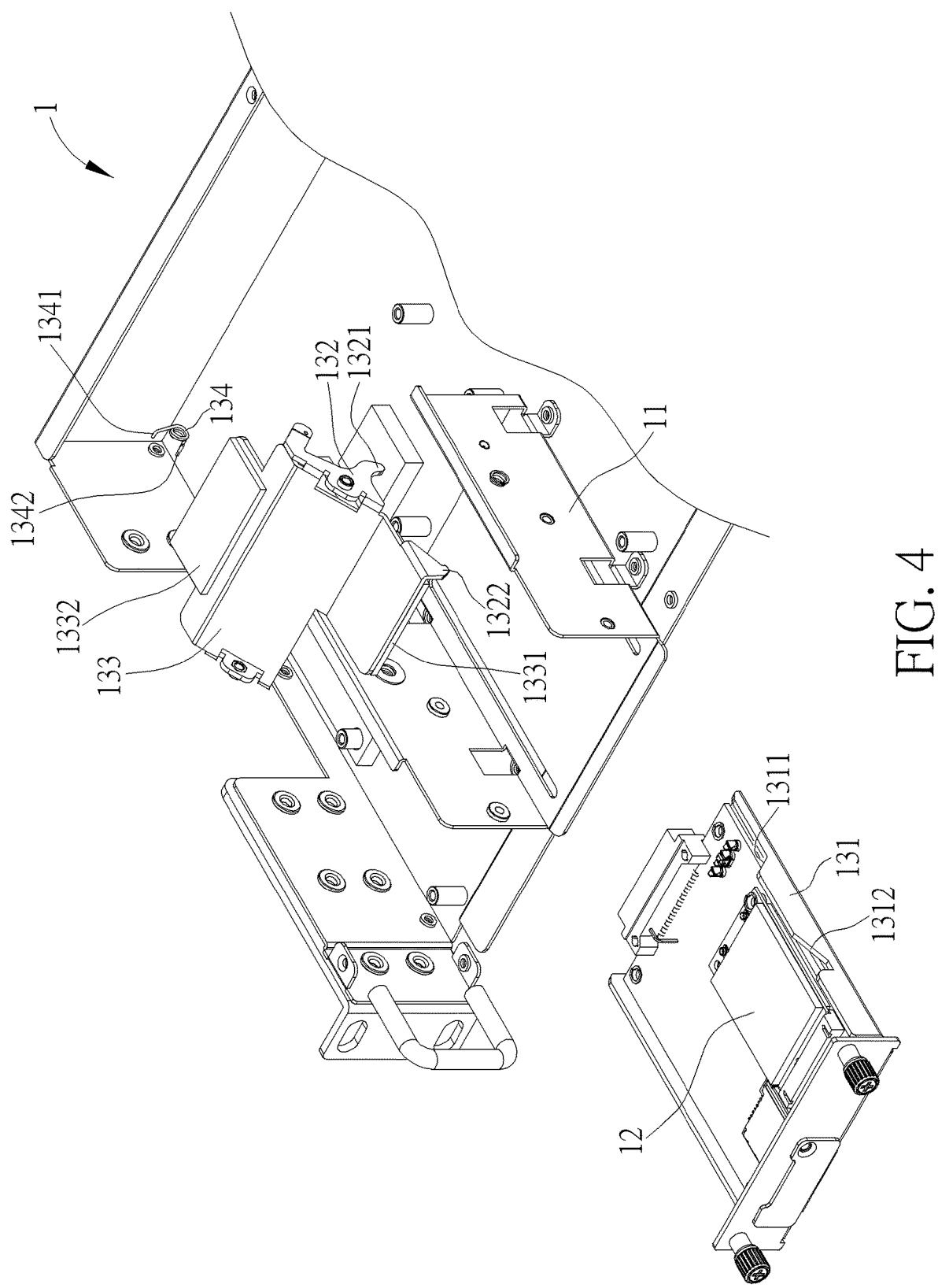
FIG. 4 and FIG. 5 are partial exploded diagrams of the electronic device at different views according to the embodiment of the present invention.
Figure 5:
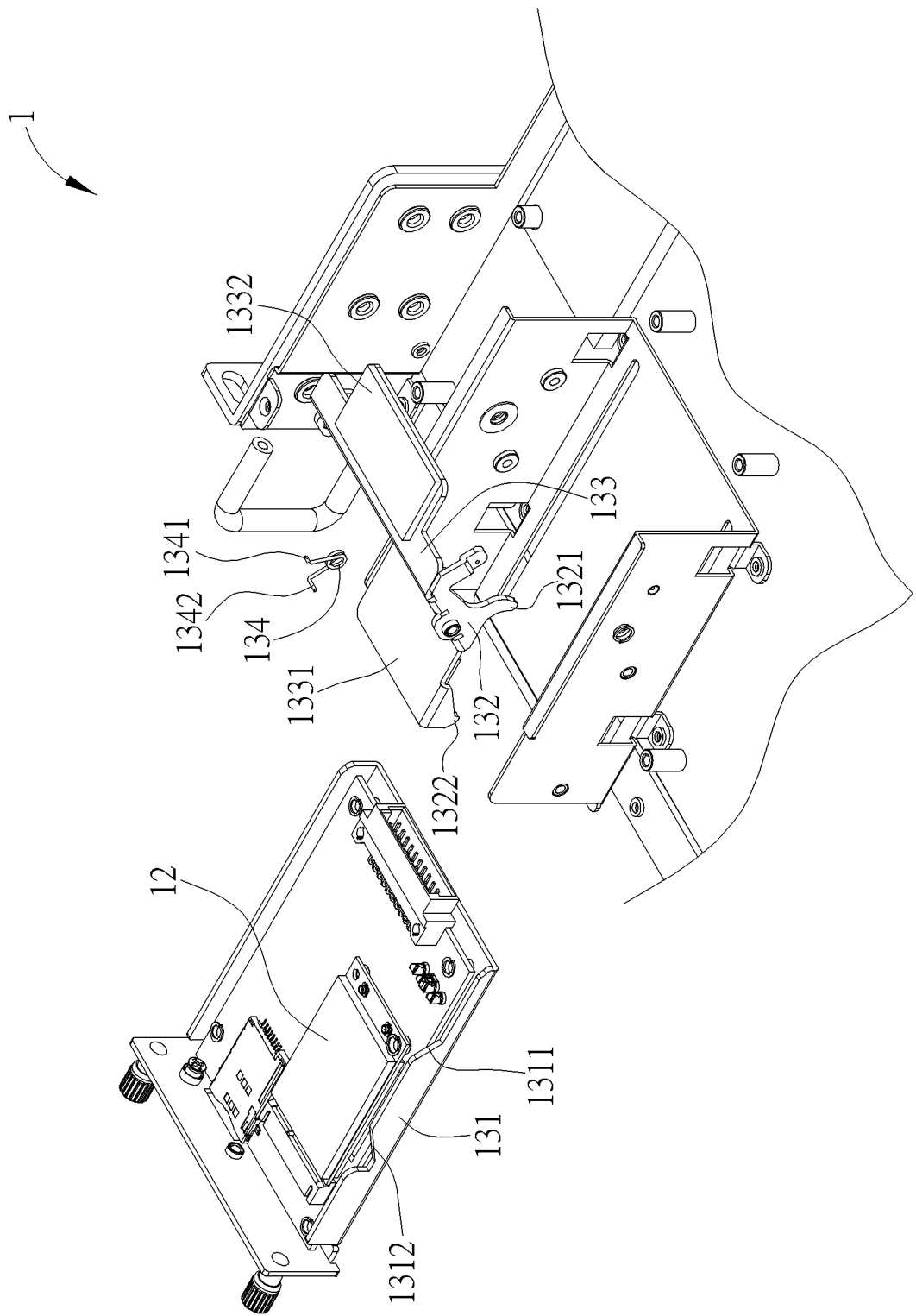
Figure 6:
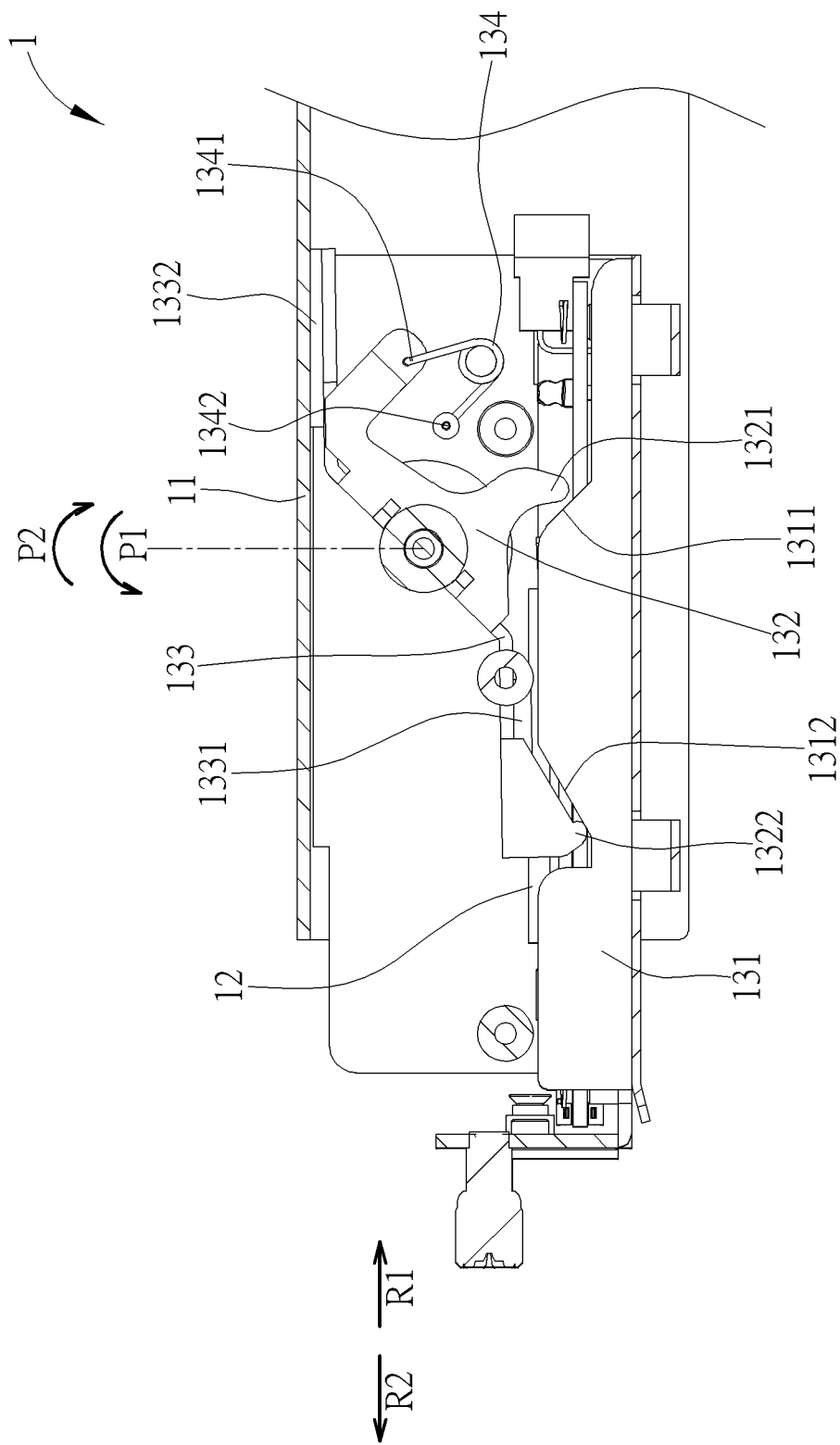
FIG. 6 and FIG. 7 are diagrams illustrating partial internal structure of the electronic device in different states according to the embodiment of the present invention.
Figure 7:
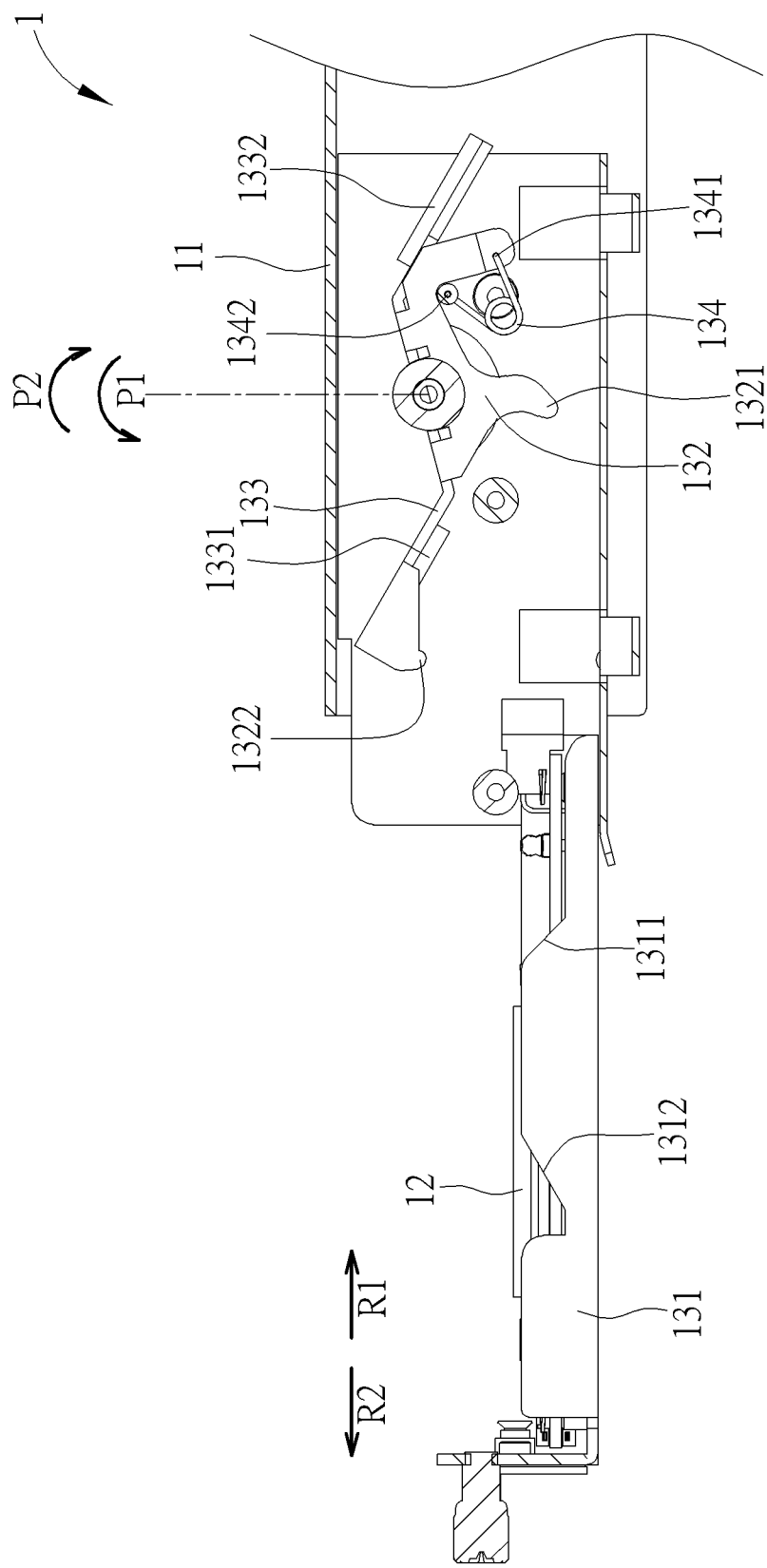

Please refer to FIG. 1 to FIG. 7. FIG. 1 is a partial schematic diagram of an electronic device 1 according to an embodiment of the present invention. FIG. 2 and FIG. 3 are partial enlarged diagrams of internal structure of the electronic device 1 according to the embodiment of the present invention. FIG. 4 and FIG. 5 are partial exploded diagrams of the electronic device 1 at different views according to the embodiment of the present invention. FIG. 6 and FIG. are diagrams illustrating partial internal structure of the electronic device 1 in different states according to the embodiment of the present invention. As shown in FIG. 1 to FIG. 7, the electronic device 1 includes a case module 11, a detachable module 12 and a heat dissipating structure 13. In order to illustrate structure and operational principle of the present invention more clearly, FIG. 2 to FIG. 7 only show part of the case module 11 which is used for accommodating and/or supporting the detachable module 12 and the heat dissipating structure 13. The detachable module 12 is slidably disposed in the case module 11 in a detachable manner. The heat dissipating structure 13 is disposed between the detachable module 12 and the case module 11 and for abutting against the detachable module 12 and the case module 11 for conducting heat generated by the detachable module 12 to the case module 11. The heat dissipating structure 13 includes a driving component 131, a driven component 132 and a heat dissipating component 133. The driving component 131 is disposed on a side of the detachable module 12 and slidable relative to the case module 11 along with the detachable module 12. The driven component 132 is pivotally disposed on the case module 11. The heat dissipating component 133 is connected to the driven component 132 and for abutting against the detachable module 12 and the case module 11. As shown in FIG. 6 and FIG. 7, when the detachable module 12 slides relative to the case module 11 along an installing direction R1, the driving component 131 drives the driven component 132 to pivot relative to the case module 11 in a first pivoting direction P1 to drive the heat dissipating component 133 to abut against the detachable module 12 and the case module 11 for conducting the heat generated by the detachable module 12 to the case module 11 by the heat dissipating component 133. When the detachable module 12 slides relative to the case module 11 along a detaching direction R2 opposite to the installing direction R1, the driving component 131 drives the driven component 132 to pivot relative to the case module 11 in a second pivoting direction P2 opposite to the first pivoting direction P1 to drive the heat dissipating component 133 to separate from the detachable module 12 and the case module 11 for preventing interference of detachment of the detachable module 12 caused by the heat dissipating component 133.

In this embodiment, the electronic device 1 can be a computer device, such as an industrial computer or a network host. The detachable module 12 can be a wireless communication module, such as a Long Term Evolution (LTE) communication module or a Wi-Fi module. However, the present invention is not limited to this embodiment.

Specifically, in order to achieve the driving component 131 to drive the heat dissipating component 133 by the driven component 132, the driving component 131 includes an installing driving portion 1311, and the driven component 132 includes an installing abutting portion 1321. In this embodiment, preferably, the installing driving portion 1311 can be an inclined surface, and the installing abutting portion 1321 can be a protrusion. When the detachable module 12 slides relative to the case module 11 along the installing direction R1, the driving component 131 drives the driven component 132 to pivot relative to the case module 11 in the first pivoting direction P1 by abutment of the installing driving portion 1311 and the installing abutting portion 1321, so as to drive the heat dissipating component 133 to abut against the detachable module 12 and the case module 11 by a first end portion 1331 and a second end portion 1332 of the heat dissipating component 133 respectively.

Besides, the driving component 131 further includes a detaching driving portion 1312, and the driven component 132 further includes a detaching abutting portion 1322. In this embodiment, preferably, the detaching driving portion 1312 can be another inclined surface, and the detaching abutting portion 1322 can be another protrusion. When the detachable module 12 slides relative to the case module 11 along the detaching direction R2, the driving component 131 drives the driven component 132 to pivot relative to the case module 11 in the second pivoting direction P2 by abutment of the detaching driving portion 1312 and the detaching abutting portion 1322, so as to drive the first end portion 1331 and the second end portion 1332 of the heat dissipating component 133 to separate from the detachable module 12 and the case module 11 respectively.

In this embodiment, preferably, the installing driving portion 1311 and the detaching driving portion 1312 can be two inclined surfaces, and the detaching driving portion 1312 and the installing driving portion 1311 can be arranged along the installing direction R1 sequentially. Furthermore, an inclined direction of the installing driving portion 1311 can be opposite to an inclined direction of the detaching driving portion 1312, i.e., a product of a slope of the installing driving portion 1311 and a slope of the detaching driving portion 1312 is negative. In addition, the installing abutting portion 1321 and the detaching abutting portion 1322 can be two protrusions, and the detaching abutting portion 1322 and the installing abutting portion 1321 can be respectively located at positions corresponding to the detaching driving portion 1312 and the installing driving portion 1311. When the detachable module 12 slides relative to the case module 11 along the installing direction R1 or the detaching direction R2, relative movement of the installing driving portion 1311 and the installing abutting portion 1321 and relative movement of the detaching driving portion 1312 and the detaching abutting portion 1322 can drive the driven component 132 to pivot relative to the case module 11. However, structures, shapes and configurations of the installing driving portion 1311, the detaching driving portion 1312, the installing abutting portion 1321 and the detaching abutting portion 1322 of the present invention are not limited to this embodiment. Any mechanism which allows the driving component to drive the driven component to pivot relative to the case module for driving the heat dissipating component to move when the detachable module slides relative to the case module, is included within the scope of the present invention.

For example, in another embodiment, the detaching driving portion and the detaching abutting portion can be omitted. In other words, the driving component can include the installing driving portion only, and the driven component can include the installing abutting portion only. Furthermore, the heat dissipating structure can further include a recovering component, such as a torsional spring, for biasing the driven component to pivot in the second pivoting direction. When the detachable module slides relative to the case module along the installing direction, the installing driving portion can abut against the installing abutting portion to drive the driven component to pivot relative to the case module in the first pivoting direction, so as to drive the first end portion and the second end portion to respectively abut against the detachable module and the case module and resiliently deform the recovering component. On the other hand, When the detachable module slides relative to the case module along the detaching direction to separate the installing driving portion from the installing abutting portion, the resiliently deformed recovering component can recover to drive the driven component to pivot relative to the case module in the second pivoting direction, so as to drive the first end portion and the second end portion to respectively separate from the detachable module and the case module.

Moreover, in this embodiment, preferably, in order to improve heat dissipation of the heat dissipating component 133, the heat dissipating component 133 can include a heat dissipating main body and two heat conductive plates. The heat dissipating main body can be made of material having enhanced heat conductivity coefficient, such as thermoplastic or metal material. The two heat conductive plates can respectively form the first end portion 1331 and the second end portion 1332. However, the present invention is not limited to this embodiment. For example, in another embodiment, in order to improve the heat dissipation of the heat dissipating component more significantly, the heat dissipating component can further includes a two-phase thermal conductivity plate or a heat pipe disposed on the heat dissipating main body.

Besides, the heat dissipating structure 13 further includes a resilient component 134 connected to the driven component 132 and the case module 11. In this embodiment, preferably, the resilient component 134 can be a torsional spring. The resilient component 134 includes a first end 1341 connected to the driven component 132 and a second end 1342 connected to the case module 11. When the driven component 132 pivots relative to the case module 11, a magnitude and a direction of a torque applied to the driven component 132 by the resilient component 134 can vary along with a pivoting angle of the driven component 132 relative to the case module 11. For example, when the driven component 132 is located at a position shown in FIG. 6, the resilient component 134 can be configured to apply a first torque in the first pivoting direction P1 to the driven component 132 to drive the heat dissipating component 133 to firmly abut against the detachable module 12 and the case module 11 for achieving enhanced heat dissipation. When the driven component 132 is located at a position shown in FIG. 7, the resilient component 134 can be configured to apply a second torque in the second pivoting direction P2, which is opposite to the first pivoting direction P1, to the driven component 132 to prevent interference of installation of the detachable module 12 caused by the driven component 132 hanging down from the case module 11 due to gravity. However, the present invention is not limited to this embodiment. For example, in another embodiment, the resilient component can be a compression spring or a leaf spring which is configured to apply a torque in the first pivoting direction only. Alternatively, in another embodiment, the resilient component can be omitted.

The operational principle of the present invention is provided as follows. When the detachable module 12 slides to be installed in the case module 11 along the installing direction R1, the driving component 131 slides relative to the case module 11 along the installing direction R1 along with the detachable module 12 to drive the driven component 132 to pivot relative to the case module 11 from the position shown in FIG. 7 to the position shown in FIG. 6 in the first pivoting direction P1 by the relative movement of the installing driving portion 1311 and the installing abutting portion 1321, so as to drive the first end portion 1331 and the second end portion 1332 of the heat dissipating component 133 to respectively abut against the detachable module 12 and the case module 11, which achieves a purpose of conducting the heat generated by the detachable module 12 to the case module 11 by the heat dissipating component 133. It should be noticed that, at this moment, a resilient force generated by the resilient component 134 can apply the first torque in the first pivoting direction P1 to the driven component 132 to increase normal forces of the heat dissipating component 133 acting on the detachable module 12 and the case module 11, so as to ensure the heat dissipating component 133 to firmly abut against the detachable module 12 and the case module 11 for achieving enhanced heat dissipation.

When the detachable module 12 slides to be detached from the case module 11 along the detaching direction R2, the driving component 131 slides relative to the case module 11 along the detaching direction R2 along with the detachable module 12 to drive the driven component 132 to pivot relative to the case module 11 from the position shown in FIG. 6 to the position shown in FIG. 7 in the second pivoting direction P2 by the relative movement of the detaching driving portion 1312 and the detaching abutting portion 1322, so as to drive the first end portion 1331 and the second end portion 1332 of the heat dissipating component 133 to respectively separate from the detachable module 12 and the case module 11, which achieves a purpose of preventing interference of the installation of the detachable module 12 caused by the heat dissipating component 133. It should be noticed that, at this moment, the resilient force generated by the resilient component 134 can apply the second torque in the second pivoting direction P2 to the driven component 132 to prevent interference of the installation of the detachable module 12 caused by the driven component 132 hanging down from the case module 11, e.g., located at the position as shown in FIG. 6, due to gravity.

In contrast to the prior art, the present invention utilizes the driving component to drive the driven component to pivot relative to the case module to drive the heat dissipating component to abut against or separate from the detachable module and the case module when the detachable module slides relative to the case module. The present invention not only has advantages of simple structure, short heat dissipating path and low heat resistance but also solves a technical problem in the prior art of inconvenient use that the heat dissipating structure needs to be detached from the case module before detaching the detachable module from the case module. Therefore, the present invention has enhanced heat dissipation and enhanced operability.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A heat dissipating structure for conducting heat generated by a detachable module to a case module, the detachable module being slidably disposed in the case module in a detachable manner, the heat dissipating structure comprising:
    a driving component disposed on a side of the detachable module and slidable relative to the case module along with the detachable module;
    a driven component pivotally disposed on the case module; and a heat dissipating component connected to the driven component and for abutting against the detachable module and the case module;

wherein when the detachable module slides relative to the case module along an installing direction, the driving component drives the driven component to pivot relative to the case module in a first pivoting direction to drive the heat dissipating component to abut against the detachable module and the case module for conducting the heat generated by the detachable module to the case module by the heat dissipating component.

2. The heat dissipating structure of claim 1, wherein the driving component comprises an installing driving portion, the driven component comprises an installing abutting portion, and the driving component drives the driven component to pivot relative to the case module in the first pivoting direction by abutment of the installing driving portion and the installing abutting portion when the detachable module slides relative to the case module along the installing direction.

3. The heat dissipating structure of claim 2, wherein the installing driving portion is an inclined surface, the installing abutting portion a protrusion, and the installing abutting portion is located at a position corresponding to the installing driving portion.

4. The heat dissipating structure of claim 1, wherein when the detachable module slides relative to the case module along a detaching direction opposite to the installing direction, the driving component drives the driven component to pivot relative to the case module in a second pivoting direction opposite to the first pivoting direction to drive the heat dissipating component to separate from the detachable module and the case module.

5. The heat dissipating structure of claim 4, wherein the driving component comprises a detaching driving portion, the driven component comprises a detaching abutting portion, and the driving component drives the driven component to pivot relative to the case module in the second pivoting direction by abutment of the detaching driving portion and the detaching abutting portion when the detachable module slides relative to the case module along the detaching direction.

6. The heat dissipating structure of claim 5, wherein the driving component further comprises an installing driving portion, the driven component further comprises an installing abutting portion, and the driving component drives the driven component to pivot relative to the case module in the first pivoting direction by abutment of the installing driving portion and the installing abutting portion when the detachable module slides relative to the case module along the installing direction.

7. The heat dissipating structure of claim 6, wherein the installing driving portion and the detaching driving portion are inclined surfaces, the installing abutting portion and the detaching abutting portion are protrusions, the installing abutting portion and the detaching abutting portion are respectively located at positions corresponding to the installing driving portion and the detaching driving portion, and the detaching driving portion and the installing driving portion are arranged along the installing direction sequentially.

8. The heat dissipating structure of claim 7, wherein an inclined direction of the installing driving portion is opposite to an inclined direction of the detaching driving portion.

9. The heat dissipating structure of claim 8, further comprising a resilient component connected to the driven component and the case module, and the resilient component applying a torque in the first pivoting direction or the second pivoting direction to the driven component.

10. The heat dissipating structure of claim 1, further comprising a resilient component connected to the driven component and the case module, and the resilient component applying a torque in the first pivoting direction or a second pivoting direction opposite to the first pivoting direction to the driven component.

11. An electronic device comprising:
a case module;
a detachable module slidably disposed in the case module in a detachable manner; and
a heat dissipating structure for conducting heat generated by the detachable module to the case module, the heat dissipating structure comprising:
a driving component disposed on a side of the detachable module and slidable relative to the case module along with the detachable module;
a driven component pivotally disposed on the case module; and
a heat dissipating component connected to the driven component and for abutting against the detachable module and the case module;
wherein when the detachable module slides relative to the case module along an installing direction, the driving component drives the driven component to pivot relative to the case module in a first pivoting direction to drive the heat dissipating component to abut against the detachable module and the case module for conducting the heat generated by the detachable module to the case module by the heat dissipating component.

12. The electronic device of claim 11, wherein the driving component comprises an installing driving portion, the driven component comprises an installing abutting portion, and the driving component drives the driven component to pivot relative to the case module in the first pivoting direction by abutment of the installing driving portion and the installing abutting portion when the detachable module slides relative to the case module along the installing direction.

13. The electronic device of claim 12, wherein the installing driving portion is an inclined surface, the installing abutting portion a protrusion, and the installing abutting portion is located at a position corresponding to the installing driving portion.

14. The electronic device of claim 11, wherein when the detachable module slides relative to the case module along a detaching direction opposite to the installing direction, the driving component drives the driven component to pivot relative to the case module in a second pivoting direction opposite to the first pivoting direction to drive the heat dissipating component to separate from the detachable module and the case module.

15. The electronic device of claim 14, wherein the driving component comprises a detaching driving portion, the driven component comprises a detaching abutting portion, and the driving component drives the driven component to pivot relative to the case module in the second pivoting direction by abutment of the detaching driving portion and the detaching abutting portion when the detachable module slides relative to the case module along the detaching direction.

16. The electronic device of claim 15, wherein the driving component further comprises an installing driving portion, the driven component further comprises an installing abutting portion, and the driving component drives the driven component to pivot relative to the case module in the first pivoting direction by abutment of the installing driving portion and the installing abutting portion when the detachable module slides relative to the case module along the installing direction.

17. The electronic device of claim 16, wherein the installing driving portion and the detaching driving portion are inclined surfaces, the installing abutting portion and the detaching abutting portion are protrusions, the installing abutting portion and the detaching abutting portion are respectively located at positions corresponding to the installing driving portion and the detaching driving portion, and the detaching driving portion and the installing driving portion are arranged along the installing direction sequentially.

18. The electronic device of claim 17, wherein an inclined direction of the installing driving portion is opposite to an inclined direction of the detaching driving portion.

19. The electronic device of claim 18, wherein the heat dissipating structure further comprises a resilient component connected to the driven component and the case module, and the resilient component applies a torque in the first pivoting direction or the second pivoting direction to the driven component.

20. The electronic device of claim 11 wherein the heat dissipating structure further comprises a resilient component connected to the driven component and the case module, and the resilient component applies a torque in the first pivoting direction or a second pivoting direction opposite to the first pivoting direction to the driven component.

* * * * *